(12) United States Patent
Imai

(10) Patent No.: US 7,297,974 B2
(45) Date of Patent: Nov. 20, 2007

(54) RADIATION IMAGE RECORDING MEDIUM AND IMAGE DISPLAYING MEDIUM

(75) Inventor: Shinji Imai, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 34 days.

(21) Appl. No.: 11/153,409

(22) Filed: Jun. 16, 2005

(65) Prior Publication Data
US 2005/0280109 A1 Dec. 22, 2005

(30) Foreign Application Priority Data
Jun. 16, 2004 (JP) ............... 2004-178169

(51) Int. Cl.
*G01N 23/04* (2006.01)
*G01N 23/08* (2006.01)
(52) U.S. Cl. .................. 250/591; 250/580
(58) Field of Classification Search ......... 250/208.1, 250/580, 590, 591; G01T 1/24; H01L 27/14, H01L 27/146
See application file for complete search history.

(56) References Cited

U.S. PATENT DOCUMENTS

| | | | | |
|---|---|---|---|---|
| 5,587,611 A | * | 12/1996 | Botka et al. | 257/458 |
| 6,091,382 A | * | 7/2000 | Shioya et al. | 345/76 |
| 6,770,901 B1 | | 8/2004 | Ogawa et al. | |
| 2001/0025935 A1 | * | 10/2001 | Ogawa | 250/580 |
| 2002/0148989 A1 | * | 10/2002 | Imai | 250/591 |
| 2006/0240338 A1 | * | 10/2006 | Satoh et al. | 430/5 |

FOREIGN PATENT DOCUMENTS

| | | | |
|---|---|---|---|
| JP | 2001066367 A | * | 3/2001 |
| JP | 2001-284565 A | | 10/2001 |
| JP | 2001284565 A | * | 10/2001 |

* cited by examiner

*Primary Examiner*—Georgia Epps
*Assistant Examiner*—Christopher M Yealy
(74) *Attorney, Agent, or Firm*—Sughrue Mion, PLLC

(57) ABSTRACT

Electric charges, which have been generated in a recording photo-conductor layer having been exposed to radiation, are accumulated at an accumulating section. The accumulated electric charges combine with electric charges, which are generated in a reading photo-conductor layer when the reading photo-conductor layer is exposed to reading light having passed through each of transparent linear electrodes, and an electric current in accordance with a radiation dose flows through each of the transparent linear electrodes. An opaque good electrically-conductive member extends at a middle region of each of the transparent linear electrodes, the middle region being other than an end region extending along a longitudinal direction of each of the transparent linear electrodes.

10 Claims, 5 Drawing Sheets

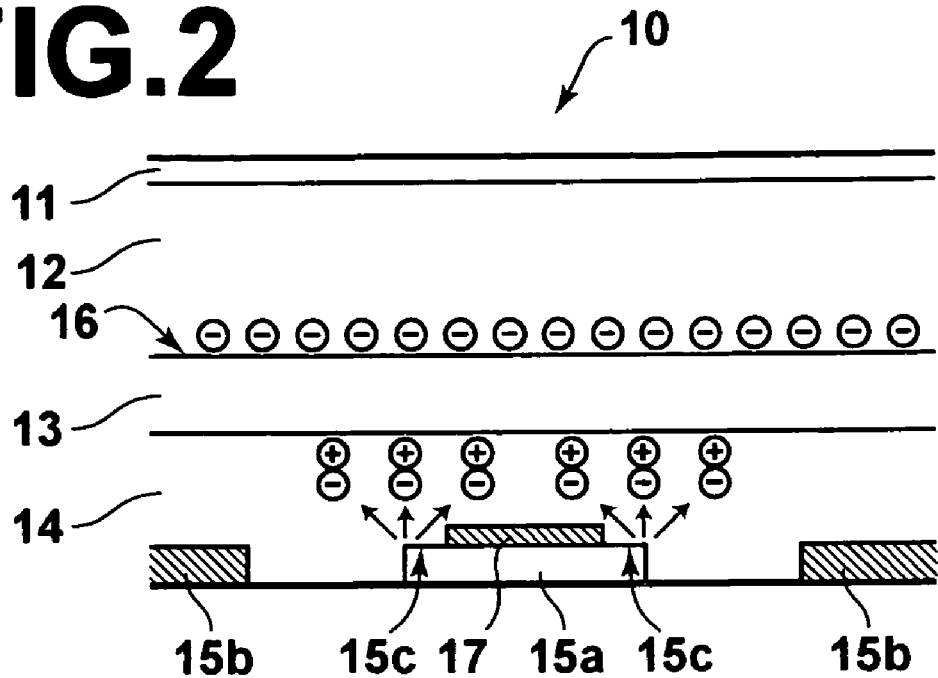
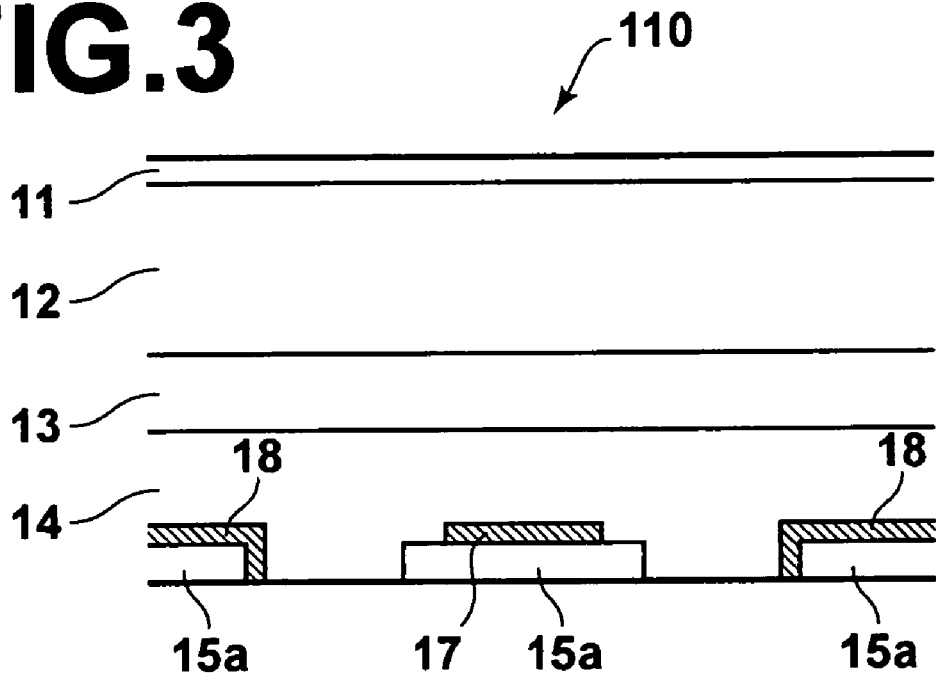

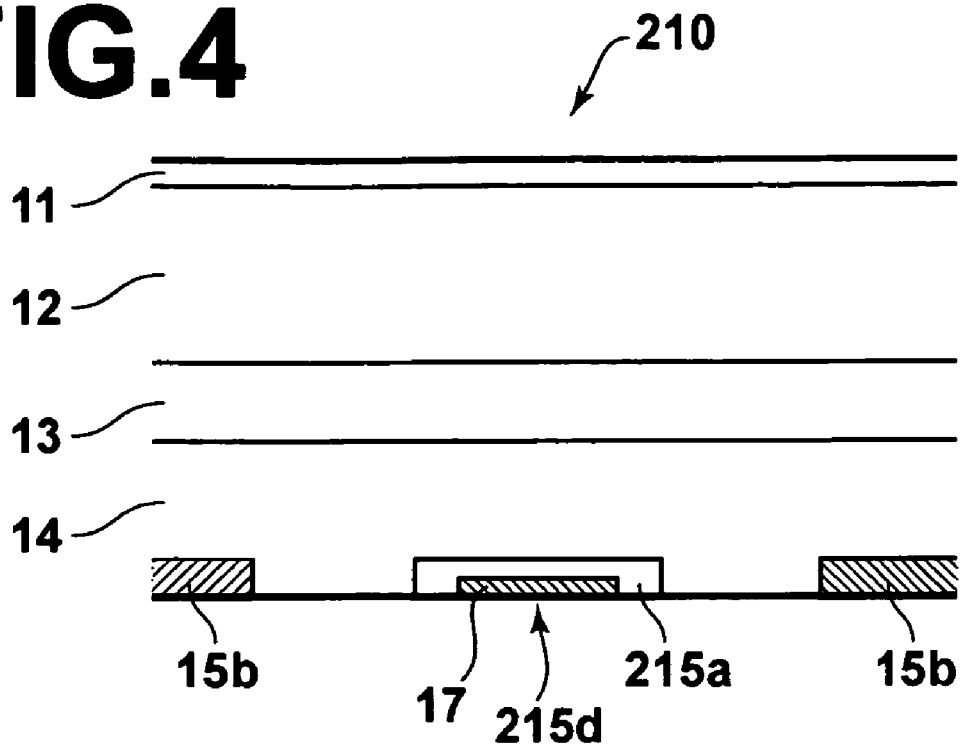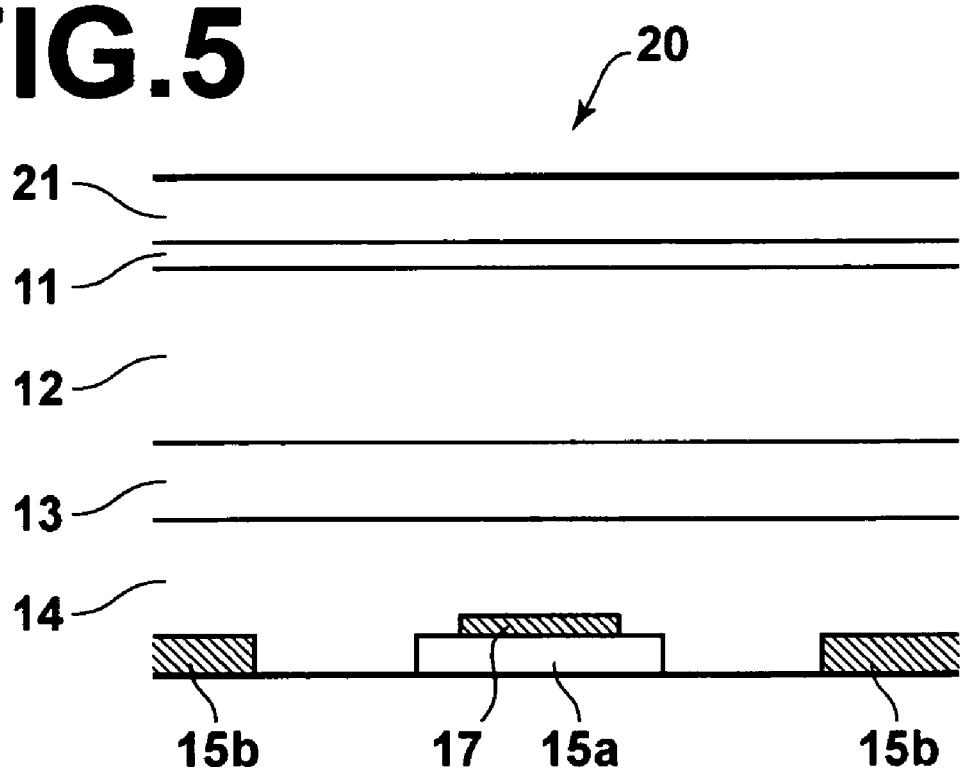

RADIATION IMAGE RECORDING MEDIUM AND IMAGE DISPLAYING MEDIUM

BACKGROUND OF THE INVENTION

1. Field of the Invention

This invention relates to a radiation image recording medium, which is capable of recording a radiation image when it is exposed to radiation carrying image information, and which comprises a plurality of transparent linear electrodes for reading of an electric charge signal formed in accordance with the recorded radiation image. This invention also relates to an image displaying medium, which is capable of displaying image information in accordance with an alteration in optical characteristics caused to occur by voltage application performed in accordance with the image information, and which comprises a plurality of transparent linear electrodes to be applied with the voltage in accordance with the image information.

2. Description of the Related Art

Various radiation image recording media, which are capable of generating electric charges when being exposed to radiation carrying image information of an object, and which are capable of recording a radiation image of the object through accumulation of the electric charges, have heretofore been proposed and used in practice in medical fields, and the like.

As one of the radiation image recording media described above, there has been proposed a radiation image recording medium, comprising:

i) a first electrode layer, which has transmissivity to radiation, ii) a recording photo-conductor layer, which generates electric charges when it is exposed to the radiation, iii) a charge transporting layer, which acts as an insulator with respect to electric charges having a certain polarity, and which acts as a conductor with respect to electric charges having an opposite polarity, iv) a reading photo-conductor layer, which generates electric charges when it is exposed to reading light, and v) a second electrode layer, which is constituted of transparent linear electrodes having transmissivity to the reading light and reading light non-transmissive linear electrodes for blocking the reading light, the transparent linear electrodes and the reading light non-transmissive linear electrodes being arrayed alternately and in parallel, the layers being overlaid in this order.

The proposed radiation image recording medium is described in, for example, U.S. Pat. No. 6,770,901.

FIGS. 7A, 7B, and 7C are explanatory views showing how a conventional radiation image recording medium operates. As illustrated in FIG. 7A, in cases where a radiation image is to be recorded with the radiation image recording medium having the constitution described above, a negative high voltage is applied to a first electrode layer 1 of the radiation image recording medium from a high voltage electric power source, which is connected to the first electrode layer 1. Also, in this state, radiation carrying image information of an object is irradiated to the first electrode layer 1. The radiation, which has been irradiated to the first electrode layer 1, passes through the first electrode layer 1 and impinges upon a recording photo-conductor layer 2. As a result, pairs of positive and negative charges are generated at an area of the recording photo-conductor layer 2, which area has been exposed to the radiation. Of the pairs of positive and negative charges having been generated in the recording photo-conductor layer 2, the positive charges move toward the first electrode layer 1, which has been charged negatively. The positive charges, which have thus moved toward the first electrode layer 1, combine with the negative charges of the first electrode layer 1 and disappear. Of the pairs of positive and negative charges having been generated in the recording photo-conductor layer 2, the negative charges move toward a second electrode layer 5, which has been charged positively. A charge transporting layer 3 acts as the insulator with respect to the negative charges. Therefore, as illustrated in FIG. 7B, the negative charges, which thus move within the recording photo-conductor layer 2 and toward the second electrode layer 5, are accumulated at a charge accumulating section 6, which is an interface between the recording photo-conductor layer 2 and the charge transporting layer 3. The recording of the radiation image is performed through the accumulation of the negative charges at the charge accumulating section 6.

As illustrated in FIG. 7C, in cases where the radiation image having thus been recorded is to be read out from the radiation image recording medium, the reading light is irradiated to the radiation image recording medium from the side of the second electrode layer 5. The reading light, which has been irradiated to the second electrode layer 5, passes through a transparent linear electrode 5a of the second electrode layer 5 and impinges upon a reading photo-conductor layer 4. As a result, pairs of positive and negative charges are generated in the reading photo-conductor layer 4. Of the pairs of positive and negative charges having been generated in the reading photo-conductor layer 4, the positive charges combine with the negative charges, which have been accumulated at the charge accumulating section 6. Also, of the pairs of positive and negative charges having been generated in the reading photo-conductor layer 4, the negative charges combine with the positive charges of the transparent linear electrode 5a and the positive charges, which flow from a reading light non-transmissive electrode 5b toward the side of the transparent linear electrode 5a via the ground. An electric current i caused to occur in this manner is detected by a current detecting amplifier 8, which is connected to the transparent linear electrode 5a. The electric current i is converted into a voltage, and an image signal is thus acquired.

By way of example, a radiation image of a mamma may be recorded by use of the radiation image recording medium described above, the recorded radiation image of the mamma may then be read out from the radiation image recording medium, and an image signal representing the radiation image of the mamma may thereby be acquired. In such cases, it is necessary for a width of each of pixels constituting the radiation image to be set at approximately 50 µm. Therefore, it is necessary for the width of each of the transparent linear electrodes to be set at approximately 10 µm to 20 µm. However, in cases where the thin transparent linear electrode is formed, since the material for the transparent linear electrode is an oxide material, such as indium tin oxide (ITO), which has a high specific resistance, the line resistance of the transparent linear electrode becomes high. Therefore, thermal noise at the current detecting amplifier becomes high, and the signal-to-noise ratio of the acquired image signal becomes low. Also, in cases where the line resistance of the transparent linear electrode is high, a time constant at the time of the acquisition of the image signal becomes long, and the response speed becomes low. As a technique for reducing the line resistance of the transparent linear electrode, there has been proposed a technique, wherein an opaque electrically-conductive member made from, for example, a metal having an electrical conductivity higher than the electrical conductivity of the transparent linear electrode, is located such that the opaque electrically-conductive member is in contact with the transparent linear electrode. The proposed technique for reducing the line resistance of the transparent linear electrode is described in, for example, Japanese Unexamined Patent Publication No. 2001-284565.

However, with the radiation image recording medium described in, for example, Japanese Unexamined Patent Publication No. 2001-284565, the opaque electrically-conductive member is located on a top surface of an end region of the transparent linear electrode, which end region extends along the longitudinal direction of the transparent linear electrode. Therefore, the reading light, which impinges upon the end region of the transparent linear electrode, is blocked by the opaque electrically-conductive member, and the electric charges are not capable of being generated at an area of the reading photo-conductor layer, which area is located in the vicinity of the end region of the transparent linear electrode. In cases where the radiation image readout is performed by the utilization of the transparent linear electrodes and the reading light non-transmissive electrodes as in the cases of the radiation image recording medium described in, for example, U.S. Pat. No. 6,770,901, generation of the electric charges at the area in the vicinity of the end region of each of the transparent linear electrodes contributes markedly to an efficiency, with which the image signal is read out. Therefore, in such cases, if the opaque electrically-conductive member is located on the top surface of the end region of the transparent linear electrode as in the cases of the radiation image recording medium described in, for example, Japanese Unexamined Patent Publication No. 2001-284565, an image signal having a sufficient level will not be capable of being acquired, and the signal-to-noise ratio of the acquired image signal will not be capable of being kept high.

As described above, in the cases of the radiation image recording medium described in, for example, U.S. Pat. No. 6,770,901, the radiation image readout is performed by the utilization of the transparent linear electrodes and the reading light non-transmissive electrodes. Besides the radiation image recording medium described in, for example, U.S. Pat. No. 6,770,901, there has also been proposed a radiation image recording medium, wherein the radiation image readout is performed by the utilization of the transparent linear electrodes alone. In the cases of the proposed radiation image recording medium, wherein the radiation image readout is performed by the utilization of the transparent linear electrodes alone, in order for noise at the current detecting amplifier to be reduced, it is necessary that the inter-neighbor capacity between the adjacent transparent linear electrodes be kept as small as possible. Therefore, it is desired that the ratio of the width of each of the transparent linear electrodes to the array pitch of the transparent linear electrodes is capable of being kept as low as possible. However, such that the ratio of the width of each of the transparent linear electrodes to the array pitch of the transparent linear electrodes may be kept as low as possible, and such that the line resistance of each of the transparent linear electrodes may be kept low, if the opaque electrically-conductive member is located on the top surface of the end region of the transparent linear electrode as in the cases of the radiation image recording medium described in, for example, Japanese Unexamined Patent Publication No. 2001-284565, the efficiency, with which the image signal is read out, will not be capable of being kept high.

Further, besides the radiation image recording media described above, an image displaying medium utilizing the transparent linear electrodes has been proposed in, for example, Japanese Patent Application No. 2003-433467. The proposed image displaying medium comprises:

i) a displaying layer, whose optical characteristics alter in accordance with an applied electric field, ii) an optical switching layer, which is capable of generating electric charges for the formation of the electric field when being exposed to an address light for displaying, and iii) an electrode layer, which is provided with a plurality of transparent linear electrodes arrayed in parallel with one another, the transparent linear electrodes being capable of transmitting the address light for displaying, the displaying layer, the optical switching layer, and the electrode layer being overlaid in this order.

The proposed image displaying medium is operated in the manner described below. Specifically, a voltage in accordance with image information is applied selectively to each of the transparent linear electrodes of the electrode layer. Also, the address light, which extends in a direction normal to the longitudinal direction of each of the transparent linear electrodes, is caused to scan from the side of the electrode layer and along the longitudinal direction of each of the transparent linear electrodes. With the irradiation of the address light, electric charges are caused to occur in the optical switching layer. An electric field is formed in the displaying layer by the electric charges occurring in the optical switching layer. The optical characteristics of the displaying layer alters in accordance with the electric field, and the image information is thereby displayed.

In the cases of the proposed image displaying medium, in order for quick image displaying to be enabled, it is necessary that the inter-neighbor capacity between the adjacent transparent linear electrodes be kept as small as possible, and that the time constant be kept as short as possible. Therefore, it is desired that the ratio of the width of each of the transparent linear electrodes to the array pitch of the transparent linear electrodes is capable of being kept as low as possible. However, in cases where the ratio of the width of each of the transparent linear electrodes to the array pitch of the transparent linear electrodes is set to be low, the area of each of the transparent linear electrodes, which area contributes to the generation of the electric charges in the optical switching layer, becomes small. Accordingly, a region, at which the image information is not displayed appropriately, occurs in the range of the area of the displaying layer, which range corresponds to the area between the adjacent transparent linear electrodes. Also, quick image displaying may be enabled with the technique, in which the opaque electrically-conductive member is located on the top surface of the end region of the transparent linear electrode as in the cases of the radiation image recording medium described in, for example, Japanese Unexamined Patent Publication No. 2001-284565, such that the line resistance may be kept low and such that the time constant may be kept short. However, if the opaque electrically-conductive member is located on the top surface of the end region of the transparent linear electrode as in the cases of the radiation image recording medium described in, for example, Japanese Unexamined Patent Publication No. 2001-284565, since the electric charges are not capable of being generated at the area of the optical switching layer, which area is located in the vicinity of the end region of the transparent linear electrode, a region, at which the image information is not displayed appropriately, will occur in the range of the area of the displaying layer, which range corresponds to the area between the adjacent transparent linear electrodes.

SUMMARY OF THE INVENTION

The primary object of the present invention is to provide a radiation image recording medium utilizing transparent linear electrodes, wherein a line resistance of each of the transparent linear electrodes is capable of being set to be low such that an efficiency, with which an image signal is read out, may be kept high, and a signal-to-noise ratio of the image signal is capable of being enhanced.

Another object of the present invention is to provide an image displaying medium utilizing transparent linear electrodes, wherein image information is capable of being displayed appropriately also in a range of an area of a displaying layer, which range corresponds to the area between adjacent transparent linear electrodes, and wherein image displaying is capable of being performed quickly.

The present invention provides a first radiation image recording medium, comprising:

i) a charge accumulating layer, which generates electric charges when it is exposed to radiation carrying image information, and which accumulates the electric charges and thereby records the image information, ii) a reading photo-conductor layer, which generates electric charges when it is exposed to a reading electromagnetic wave, the electric charges combining with the electric charges, which have been accumulated in the charge accumulating layer, and iii) an electrode layer, which is constituted of a plurality of transparent linear electrodes having transmissivity to the reading electromagnetic wave and a plurality of electromagnetic wave non-transmissive linear electrodes for blocking the reading electromagnetic wave, the transparent linear electrodes and the electromagnetic wave non-transmissive linear electrodes being arrayed alternately and in parallel, the charge accumulating layer, the reading photo-conductor layer, and the electrode layer being overlaid in this order, wherein the improvement comprises the provision of an opaque good electrically-conductive member, which extends at a middle region of each of the transparent linear electrodes, the middle region being other than an end region extending along a longitudinal direction of each of the transparent linear electrodes.

The present invention also provides a second radiation image recording medium, comprising:

i) a charge accumulating layer, which generates electric charges when it is exposed to radiation carrying image information, and which accumulates the electric charges and thereby records the image information, ii) a reading photo-conductor layer, which generates electric charges when it is exposed to a reading electromagnetic wave, the electric charges combining with the electric charges, which have been accumulated in the charge accumulating layer, and iii) an electrode layer, which is constituted of a plurality of transparent linear electrodes having transmissivity to the reading electromagnetic wave, the transparent linear electrodes being arrayed in parallel, the charge accumulating layer, the reading photo-conductor layer, and the electrode layer being overlaid in this order, wherein the improvement comprises the provision of an opaque good electrically-conductive member, which extends at a middle region of each of the transparent linear electrodes, the middle region being other than an end region extending along a longitudinal direction of each of the transparent linear electrodes.

The second radiation image recording medium in accordance with the present invention should preferably be modified such that a ratio of a width of each of the transparent linear electrodes to an array pitch of the transparent linear electrodes is at most 40%.

Each of the first radiation image recording medium and the second radiation image recording medium in accordance with the present invention should preferably be modified such that a width of the end region of each of the transparent linear electrodes is at least 0.5 µm.

The present invention further provides an image displaying medium, comprising:

i) a displaying layer, whose optical characteristics alter in accordance with an applied electric field, ii) an optical switching layer, which generates electric charges for the formation of the electric field when being exposed to a displaying electromagnetic wave, and iii) an electrode layer, which is constituted of a plurality of transparent linear electrodes having transmissivity to the displaying electromagnetic wave, the transparent linear electrodes being arrayed in parallel, the displaying layer, the optical switching layer, and the electrode layer being overlaid in this order, wherein the improvement comprises the provision of an opaque good electrically-conductive member, which extends at a middle region of each of the transparent linear electrodes, the middle region being other than an end region extending along a longitudinal direction of each of the transparent linear electrodes.

The term "opaque good electrically-conductive member" as used herein means the opaque member, which has an electrical conductivity higher than the electrical conductivity of the transparent linear electrodes.

The end region extending along the longitudinal direction of each of the transparent linear electrodes need not necessarily be the entire area of the end region extending from one of extremities of each of the transparent linear electrodes, which extremities are taken with respect to the longitudinal direction of each of the transparent linear electrodes, to the other extremity. Specifically, the opaque good electrically-conductive member may be located at part of the end region extending from one of the extremities of each of the transparent linear electrodes, which extremities are taken with respect to the longitudinal direction of each of the transparent linear electrodes, to the other extremity, in a manner such that the reading electromagnetic wave, which has passed through the end region, is capable of substantially impinging upon the reading photo-conductor layer. Also, both the opposite end regions of each of the transparent linear electrodes need not necessarily be free from the opaque good electrically-conductive member. Specifically, the opaque good electrically-conductive member may be located at one of the opposite end regions of each of the transparent linear electrodes and may not be located at the other end region of each of the transparent linear electrodes.

The term "middle region" as used herein means the region other than the aforesaid end region of each of the transparent linear electrodes.

The opaque good electrically-conductive member is located such that it extends at the middle region of each of the transparent linear electrodes. The opaque good electrically-conductive member need not necessarily be located at the entire area of the middle region extending from one of the extremities of each of the transparent linear electrodes, which extremities are taken with respect to the longitudinal direction of each of the transparent linear electrodes, to the other extremity. Specifically, the opaque good electrically-conductive member may not be located at part of the middle region extending from one of the extremities of each of the transparent linear electrodes, which extremities are taken with respect to the longitudinal direction of each of the transparent linear electrodes, to the other extremity.

The term "alteration in optical characteristics" as used herein for the image displaying medium means that the optical characteristics alters such that the alteration is capable of being perceived visually. The displaying layer may be, for example, a layer provided with a liquid crystal layer. Alternatively, the displaying layer may be a layer provided with a dispersion layer containing a plurality of micro-capsules dispersed therein, each of the micro-capsules containing positively charged white particles and negatively charged black particles.

With each of the first radiation image recording medium and the second radiation image recording medium in accordance with the present invention, the opaque good electrically-conductive member extends at the middle region of each of the transparent linear electrodes, the middle region being other than the end region extending along the longitudinal direction of each of the transparent linear electrodes. Therefore, the electric charges are capable of being generated also at the area of the reading photo-conductor layer, which area is located in the vicinity of the end region of each of the transparent linear electrodes. Accordingly, the line resistance of each of the transparent linear electrodes is capable of being set to be low such that the efficiency, with which an image signal is read out, may be kept high, and the signal-to-noise ratio of the image signal is capable of being enhanced.

With the modification of the second radiation image recording medium in accordance with the present invention, wherein the ratio of the width of each of the transparent linear electrodes to the array pitch of the transparent linear electrodes is at most 40%, the inter-neighbor capacity between the adjacent transparent linear electrodes is capable of being kept small. Therefore, noise due to the inter-neighbor capacity is capable of being reduced. Also, the signal-to-noise ratio of the acquired image signal is capable of being enhanced.

Each of the first radiation image recording medium and the second radiation image recording medium in accordance with the present invention may be modified such that the width of the end region of each of the transparent linear electrodes is at least 0.5 µm. With the modification described above, for example, in cases where reading light (blue light) having a wavelength of approximately 0.5 µm is utilized as the reading electromagnetic wave, the reading light is capable of being irradiated sufficiently to the reading photo-conductor layer.

With the image displaying medium in accordance with the present invention, the opaque good electrically-conductive member extends at the middle region of each of the transparent linear electrodes, the middle region being other than the end region extending along the longitudinal direction of each of the transparent linear electrodes. Therefore, the electric charges are capable of being generated also at the area of the optical switching layer, which area is located in the vicinity of the end region of each of the transparent linear electrodes, and an electric field is capable of being formed also in the range of the area of the displaying layer, which range corresponds to the area between adjacent transparent linear electrodes. Accordingly, the image information is capable of being displayed appropriately also in the range of the area of the displaying layer, which range corresponds to the area between adjacent transparent linear electrodes. Further, the line resistance of each of the transparent linear electrodes is capable of being set to be low, and the time constant is capable of being kept short. Accordingly, the image displaying is capable of being performed quickly.

BRIEF DESCRIPTION OF THE DRAWINGS

FIG. 2 is an explanatory sectional view showing how the radiation image recording medium of FIG. 1A operates, FIG. 3 is an explanatory sectional view showing a modification of reading light non-transmissive electrodes, which may be employed in the radiation image recording medium in accordance with the present invention, FIG. 4 is an explanatory sectional view showing a modification of an opaque good electrically-conductive member, which may be employed in the radiation image recording medium in accordance with the present invention, FIG. 5 is an explanatory sectional view showing a different embodiment of the radiation image recording medium in accordance with the present invention.

DESCRIPTION OF THE PREFERRED EMBODIMENTS

The present invention will hereinbelow be described in further detail with reference to the accompanying drawings.

Figure 1A:
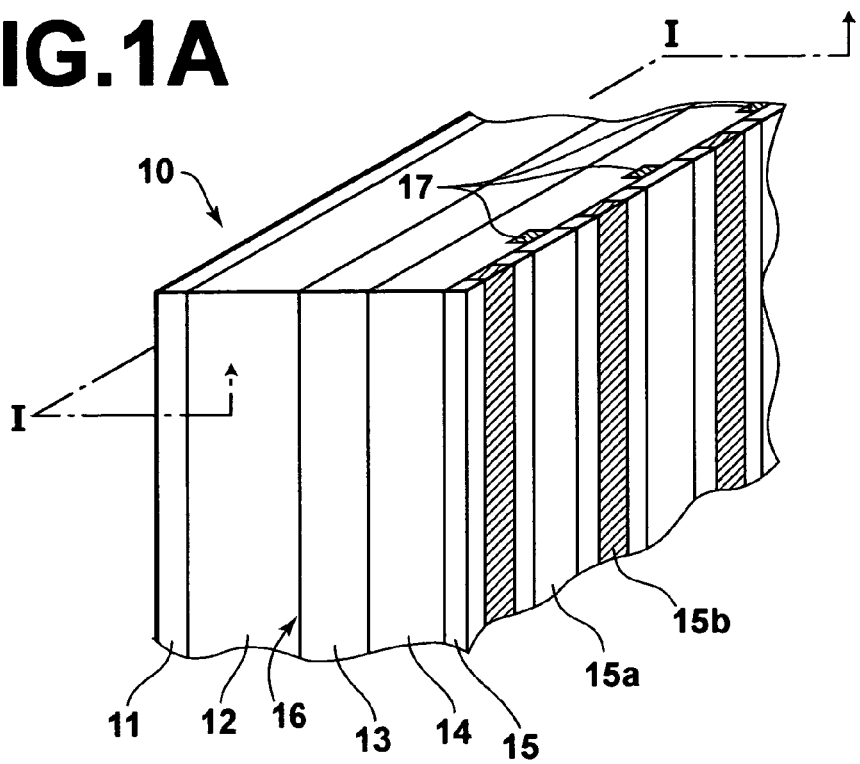
FIG. 1A is a perspective view showing an embodiment of the radiation image recording medium in accordance with the present invention.
Figure 1B:
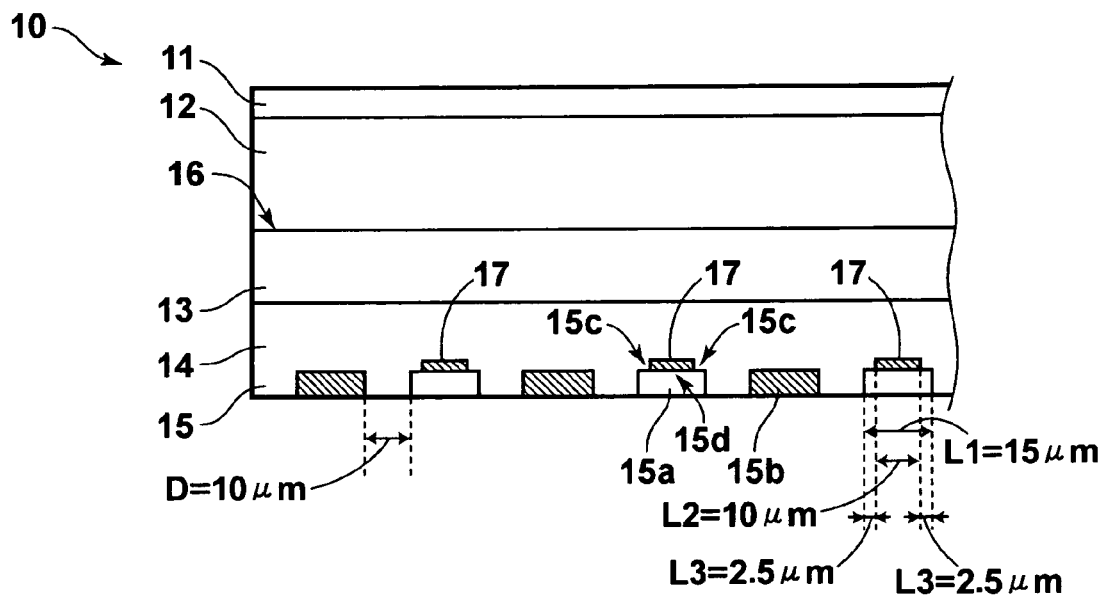
FIG. 1B is a sectional view taken on line I-I of FIG. 1A.

FIG. 1A is a perspective view showing an embodiment of the radiation image recording medium in accordance with the present invention. FIG. 1B is a sectional view taken on line I-I of FIG. 1A.

As illustrated in FIG. 1A and FIG. 1B, a radiation image recording medium 10 comprises a first electrode layer 11, which has transmissivity to radiation carrying image information of an object. The radiation image recording medium 10 also comprises a recording photo-conductor layer 12, which generates electric charges when it is exposed to the radiation. The radiation image recording medium 10 further comprises a charge transporting layer 13. The charge transporting layer 13 acts as an insulator with respect to electric charges having a certain polarity, which electric charges have been generated in the recording photo-conductor layer 12, and acts as a conductor with respect to electric charges having an opposite polarity, which electric charges have been generated in the recording photo-conductor layer 12. The radiation image recording medium 10 still further comprises a reading photo-conductor layer 14, which generates electric charges when it is exposed to reading light. The radiation image recording medium 10 also comprises a second electrode layer 15, which is constituted of a plurality of transparent linear electrodes 15a, 15a, . . . having transmissivity to the reading light and a plurality of reading light non-transmissive linear electrodes 15b, 15b, . . . for blocking the reading light. The transparent linear electrodes 15a, 15a, . . . and the reading light non-transmissive linear electrodes 15b, 15b, . . . are arrayed alternately and in parallel. The first electrode layer 11, the recording photo-conductor layer 12, the charge transporting layer 13, the reading photo-conductor layer 14, and the second electrode layer 15 are overlaid in this order. A charge accumulating section 16, which accumulates the electric charges having been generated in the recording photo-conductor layer 12, is formed at an interface between the recording photo-conductor layer 12 and the charge transporting layer 13.

The first electrode layer 11 may be constituted of a material capable of transmitting the radiation. For example, the first electrode layer 11 may be constituted of a tin dioxide film ($SnO_2$), an indium tin oxide (ITO) film, an Idemitsu Indium X-metal Oxide (IDIXO) film (an amorphous light-transmissive oxide film, supplied by Idemitsu Kosan K. K.), or the like, which has a thickness falling within the range of 50 nm to 200 nm. As the first electrode layer 11, an Al film or an Au film having a thickness of 100 nm may also be utilized.

As described above, the second electrode layer 15 is constituted of the transparent linear electrodes 15a, 15a, . . . and the reading light non-transmissive linear electrodes 15b, 15b, . . . The transparent linear electrodes 15a, 15a, . . . may be constituted of one of various materials, which are capable of transmitting the reading light and have an electrical conductivity. For example, as in the cases of the first electrode layer 11, the transparent linear electrodes 15a, 15a, . . . may be constituted of ITO, IDIXO, or the like. Alternatively, the transparent linear electrodes 15a, 15a, . . . may be constituted of a metal material, such as Al or Cr, which has a thickness (e.g., approximately 10 nm) such that the metal material is capable of transmitting the reading light. The reading light non-transmissive linear electrodes 15b, 15b, . . . may be constituted of one of various materials, which are capable of blocking the reading light and have the electrical conductivity. For example, the reading light non-transmissive linear electrodes 15b, 15b, . . . may be constituted of a metal material, such as Al or Cr, which has a thickness (e.g., approximately 100 nm) such that the metal material is capable of blocking the reading light. As illustrated in FIG. 1B, a distance D between the transparent linear electrode 15a and the reading light non-transmissive linear electrode 15b in the radiation image recording medium 10 is equal to 10 μm.

The recording photo-conductor layer 12 may be constituted of one of various materials, which are capable of generating the electric charges when being exposed to the radiation. In this embodiment, the recording photo-conductor layer 12 is constituted of a material, which contains a-Se as the principal constituent. The material, which contains a-Se as the principal constituent, have the advantages in that a quantum efficiency is comparatively high with respect to the radiation and in that a dark resistance is high. The thickness of the material, which contains a-Se as the principal constituent and constitutes the recording photo-conductor layer 12, may be approximately 500 μm.

The charge transporting layer 13 may be constituted of one of various materials having the characteristics such that the difference between the mobility of the electric charges, which occur in the first electrode layer 11 at the time of the recording of the radiation image, and the mobility of the electric charges, which have the polarity opposite to the polarity of the electric charges occurring in the first electrode layer 11, is as large as possible (e.g., at least $10^2$, and preferably at least $10^3$). By way of example, in cases where a negative voltage is applied to the first electrode layer 11 at the time of the recording of the radiation image, the charge transporting layer 13 should preferably be constituted of a material having the characteristics such that the difference between the mobility of the negative charges and the mobility of the electric charges having the opposite polarity, i.e. the positive charges, is large. Specifically, the charge transporting layer 13 should preferably be constituted of, for example, an organic compound, such as a poly-N-vinylcarbazole (PVK), N,N'-diphenyl-N,N'-bis(3-methylphenyl)-[1,1'-biphenyl]-4, 4'-diamine (TPD), or a disk-shaped liquid crystal; or a semiconductor substance, such as a polymer (polycarbonate, polystyrene, PVK) dispersion of TPD, or a-Se doped with 10 ppm to 200 ppm of Cl.

The reading photo-conductor layer 14 may be constituted of one of various materials, which exhibit the electrical conductivity when being exposed to the reading light. For example, the reading photo-conductor layer 14 should preferably be constituted of a photo-conductive material containing, as a principal constituent, at least one substance selected from the group consisting of a-Se, Se—Te, Se—As—Te, metal-free phthalocyanine, metallo-phthalocyanine, magnesium phthalocyanine (MgPc), phase II of vanadyl phthalocyanine (VoPc), and copper phthalocyanine (CuPc). The thickness of the reading photo-conductor layer 14 should preferably fall within the range of 0.1 μm to 1 μm.

In this embodiment, an opaque good electrically-conductive member 17 extends on the top surface of a middle region 15d of each of the transparent linear electrodes 15a, 15a, . . . of the radiation image recording medium 10, which middle region is other than end regions 15c, 15c of each of the transparent linear electrodes 15a, 15a, . . . The opaque good electrically-conductive member 17 may be constituted of one of various materials, which have an electrical conductivity higher than the electrical conductivity of each of the transparent linear electrodes 15a, 15a, . . . By way of example, the opaque good electrically-conductive member 17 may be constituted of Al, Ag, Cu, or the like. Also, in this embodiment, as illustrated in FIG. 1B, a width L1 of each of the transparent linear electrodes 15a, 15a, . . . of the radiation image recording medium 10 is equal to 15 μm, and the width L1 of each of the reading light non-transmissive linear electrodes 15b, 15b, . . . of the radiation image recording medium 10 is equal to 15 μm. A width L2 of the opaque good electrically-conductive member 17 is equal to 10 μm. Further, a width L3 of each of the end regions 15c, 15c is equal to 2.5 μm. The width L3 of each of the end regions 15c, 15c, which are free from the opaque good electrically-conductive member 17, should preferably be longer than the wavelength of the reading light. For example, in cases where blue light having a wavelength of approximately 0.5 μm is utilized as the reading light, the width L3 of each of the end regions 15c, 15c should preferably be equal to at least 0.5 μm, and should more preferably fall within the range of approximately 1 μm to approximately 2 μm. Also, the total of the widths L3, L3 of the two end regions 15c, 15c should preferably be equal to at least ⅓ of the width L1 of each of the transparent linear electrodes 15a, 15a, . . .

In this embodiment of the radiation image recording medium 10, the entire area of each of the end regions 15c, 15c extending from one of the extremities of each of the transparent linear electrodes 15a, 15a, . . . , which extremities are taken with respect to the longitudinal direction of each of the transparent linear electrodes 15a, 15a, . . . , to the other extremity is free from the opaque good electrically-conductive member 17. However, the entire area of each of the end regions 15c, 15c extending from one of the extremities of each of the transparent linear electrodes 15a, 15a, . . . , which extremities are taken with respect to the longitudinal direction of each of the transparent linear electrodes 15a, 15a, . . . , to the other extremity need not necessarily be free from the opaque good electrically-conductive member 17. Specifically, the opaque good electrically-conductive member 17 may be located at part of each of the end regions 15c, 15c extending from one of the extremities of each of the transparent linear electrodes 15a, 15a, . . . , which extremities are taken with respect to the longitudinal direction of each of the transparent linear electrodes 15a, 15a, . . . , to the other extremity, in a manner such that the reading light, which has passed through the end region 15c, is capable of substantially impinging upon the reading photo-conductor layer 14. Also, both the opposite end regions 15c, 15c of each of the transparent linear electrodes 15a, 15a, . . . need not necessarily be free from the opaque good electrically-conductive member 17. Specifically, the opaque good electrically-conductive member 17 may be located at one of the opposite end regions 15c, 15c of each of the transparent linear electrodes 15a, 15a, . . . and may not be located at the other end region 15c of each of the transparent linear electrodes 15a, 15a, . . .

Further, in this embodiment of the radiation image recording medium 10, the opaque good electrically-conductive member 17 is located such that it extends at the entire area of the middle region 15d of each of the transparent linear electrodes 15a, 15a, . . . , the middle region 15d extending from one of the extremities of each of the transparent linear electrodes 15a, 15a, . . . , which extremities are taken with respect to the longitudinal direction of each of the transparent linear electrodes 15a, 15a, . . . , to the other extremity. However, the opaque good electrically-conductive member 17 need not necessarily be located at the entire area of the middle region 15d of each of the transparent linear electrodes 15a, 15a, . . . , the middle region 15d extending from one of the extremities of each of the transparent linear electrodes 15a, 15a, . . . , which extremities are taken with respect to the longitudinal direction of each of the transparent linear electrodes 15a, 15a, . . . , to the other extremity. Specifically, the opaque good electrically-conductive member 17 may not be located at part of the middle region 15d extending from one of the extremities of each of the transparent linear electrodes 15a, 15a, . . . , which extremities are taken with respect to the longitudinal direction of each of the transparent linear electrodes 15a, 15a, . . . , to the other extremity.

As illustrated in FIG. 2, in cases where the radiation carrying the image information of the object is irradiated to the radiation image recording medium 10 having the constitution described above, and the radiation image is thereby recorded on the radiation image recording medium 10, negative charges in an amount proportional to the radiation dose are accumulated at the charge accumulating section 16. In cases where the electric charges having been accumulated at the charge accumulating section 16 are to be read out, the reading light is irradiated to the radiation image recording medium 10 from the side of the second electrode layer 15. The reading light, which has been irradiated to the radiation image recording medium 10 from the side of the second electrode layer 15, passes through each of the transparent linear electrodes 15a, 15a, . . . and then impinges upon the reading photo-conductor layer 14. When the reading photo-conductor layer 14 is thus exposed to the reading light, electric charges are generated in the reading photo-conductor layer 14. As described above, in this embodiment, the end regions 15c, 15c of each of the transparent linear electrodes 15a, 15a, . . . are free from the opaque good electrically-conductive member 17. Therefore, the reading light is capable of impinging upon the area of the reading photo-conductor layer 14, which area is located in the vicinity of each end region 15c, and thereby causing the electric charges to occur in the aforesaid area of the reading photo-conductor layer 14. Therefore, the electric charges are capable of occurring in a wide range of the area of the reading photo-conductor layer 14, which range is taken in the array direction of the transparent linear electrodes 15a, 15a, . . . (i.e., in the direction normal to the longitudinal direction of each of the transparent linear electrodes 15a, 15a, . . . ). Accordingly, the line resistance of each of the transparent linear electrodes 15a, 15a, . . . is capable of being set to be low such that the efficiency, with which an image signal is read out, may be kept high, and the signal-to-noise ratio of the image signal is capable of being enhanced.

Furthermore, in this embodiment of the radiation image recording medium 10, the reading light non-transmissive linear electrodes 15b, 15b, . . . in the second electrode layer 15 are constituted of the material which blocks the reading light. Alternatively, for example, as in the cases of a radiation image recording medium 110 illustrated in FIG. 3, side faces and the top surface of a transparent linear electrode 15a, which has the transmissivity to the reading light, may be covered with a reading light non-transmissive material 18, which blocks the reading light, and each of the reading light non-transmissive linear electrodes may thereby be formed.

Also, in this embodiment of the radiation image recording medium 10, the opaque good electrically-conductive member 17 is located on the top surface of each of the transparent linear electrodes 15a, 15a, . . . Alternatively, for example, as in the cases of a radiation image recording medium 210 illustrated in FIG. 4, the opaque good electrically-conductive member 17 may be located at a middle region 215d within a transparent linear electrode 215a. Specifically, the opaque good electrically-conductive member 17 may be located in one of various ways, such that the reading light is capable of passing through the end region of the transparent linear electrode.

Further, in this embodiment of the radiation image recording medium 10, the second electrode layer 15 is constituted of the transparent linear electrodes 15a, 15a, . . . and the reading light non-transmissive linear electrodes 15b, 15b, . . . Alternatively, the reading light non-transmissive linear electrodes 15b, 15b, . . . may be omitted, and the second electrode layer may be constituted of the transparent linear electrodes 15a, 15a, . . . alone. In cases where the second electrode layer is constituted of the transparent linear electrodes 15a, 15a, . . . alone, the ratio of the width of each of the transparent linear electrodes 15a, 15a, . . . to the array pitch of the transparent linear electrodes 15a, 15a, . . . should preferably be at most 40%. Also, in such cases, the width of each of the end regions 15c, 15c, which are free from the opaque good electrically-conductive member 17, should preferably be longer than the wavelength of the reading light. For example, in cases where the blue light having a wavelength of approximately 0.5 µm is utilized as the reading light, the width of each of the end regions 15c, 15c should preferably be equal to at least 0.5 µm, and should more preferably fall within the range of approximately 1 µm to approximately 2 µm. Also, the total of the widths of the two end regions 15c, 15c should preferably be equal to at least ⅓ of the width of each of the transparent linear electrodes 15a, 15a, . . .

Furthermore, the aforesaid embodiment of the radiation image recording medium 10 is constituted as the direct conversion type of the radiation image recording medium, which directly receives the radiation and generates the electric charges. Alternatively, as illustrated in FIG. 5, the radiation image recording medium in accordance with the present invention may be constituted as an indirect conversion type of a radiation image recording medium 20. The radiation image recording medium 20 comprises a wavelength converting layer 21, which receives the radiation and generates visible light. The wavelength converting layer 21 is located on the side of the first electrode layer 11. Also, as in the aforesaid embodiment of the radiation image recording medium 10, the opaque good electrically-conductive member 17 is located on each of the transparent linear electrodes 15a, 15a, . . . In the cases of the indirect conversion type of the radiation image recording medium 20, it is necessary for the first electrode layer 11 to be made from a material, which has the transmissivity to the visible light having been generated in the wavelength converting layer 21. Also, it is necessary for the recording photo-conductor layer 12 to be made from a material, which is capable of generating the electric charges when it is exposed to the visible light described above. By way of example, the wavelength converting layer 21 may be formed by use of a phosphor, such as CaWO. The thickness of the recording photo-conductor layer 12 should preferably be equal to approximately 10 μm.

The layer constitution of the radiation image recording medium in accordance with the present invention is not limited to the layer constitutions employed in the embodiments described above. A different layer may be added to the layer constitutions employed in the embodiments described above.

Figure 6A:
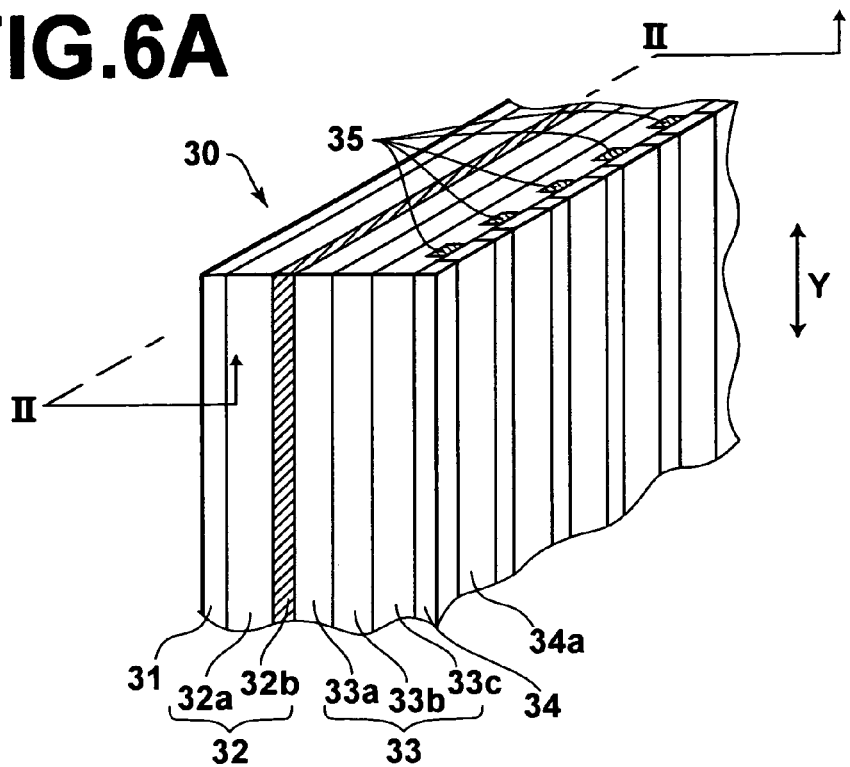
FIG. 6A is a perspective view showing an embodiment of the image displaying medium in accordance with the present invention.
Figure 6B:
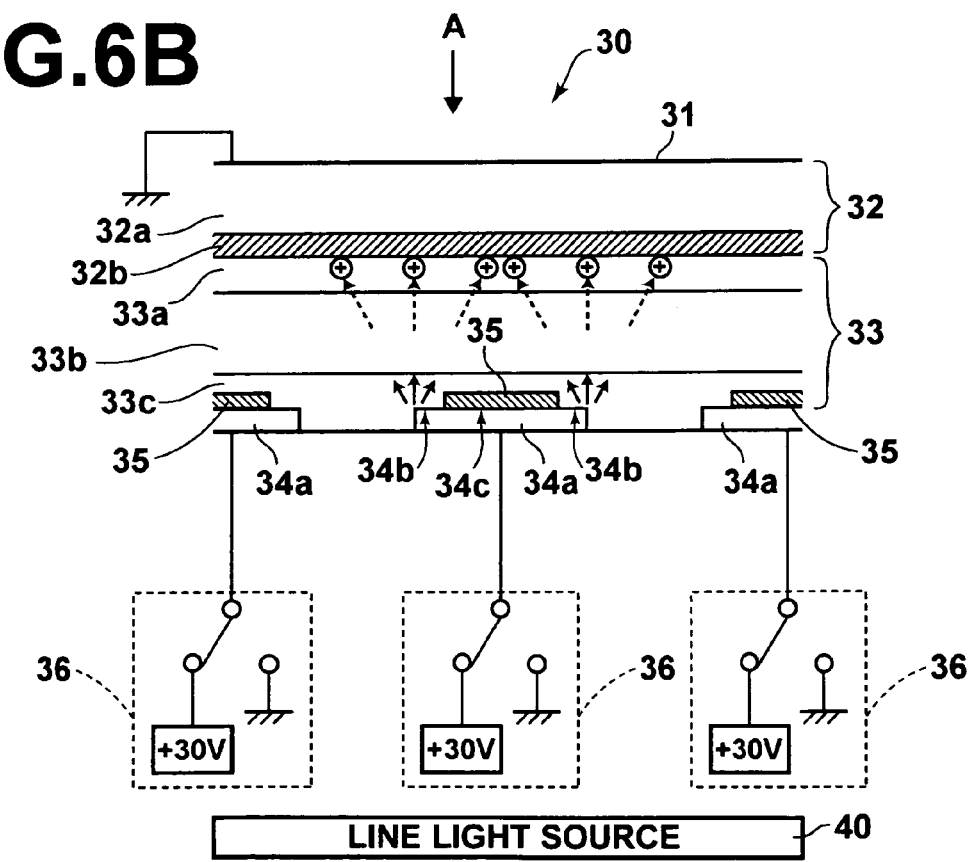
FIG. 6B is a sectional view taken on line II-II of FIG. 6A, and FIGS. 7A, 7B, and 7C are explanatory views showing how a conventional radiation image recording medium operates.
Figure 7A:
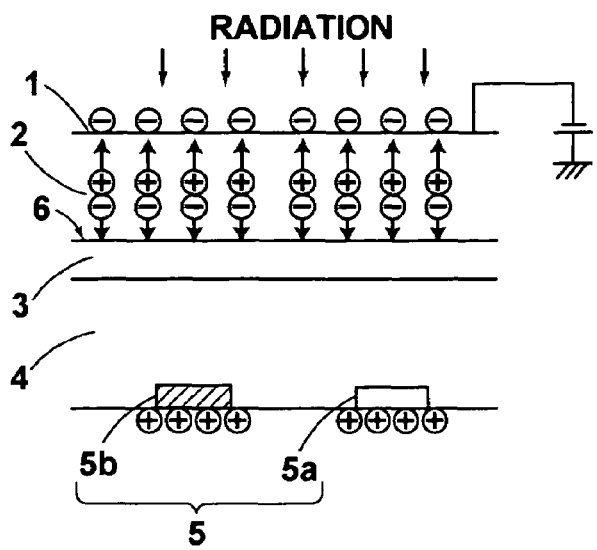
Figure 7B:
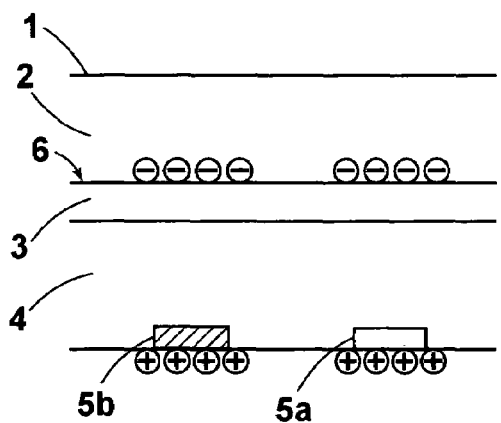
Figure 7C:
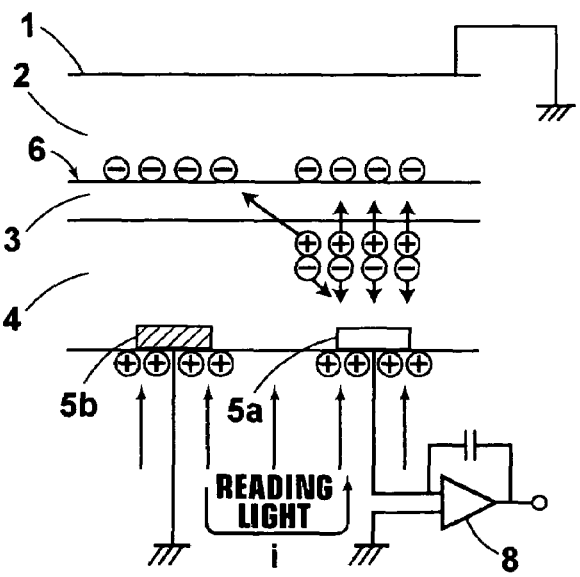

An image displaying apparatus, in which an embodiment of the image displaying medium in accordance with the present invention is employed, will be described hereinbelow with reference to FIG. 6A and FIG. 6B. FIG. 6A is a perspective view showing an embodiment of the image displaying medium in accordance with the present invention. FIG. 6B is a sectional view taken on line II-II of FIG. 6A.

As illustrated in FIG. 6A, an image displaying medium 30, which is an embodiment of the image displaying medium in accordance with the present invention and is employed in the image displaying apparatus, comprises a first electrode layer 31, which is capable of transmitting visible light. The image displaying medium 30 also comprises a displaying layer 32, whose optical characteristics alter in accordance with an electric field. The image displaying medium 30 further comprises an optical switching layer 33, which is capable of exhibiting electrical conductivity when being exposed to reading light. The image displaying medium 30 still further comprises a second electrode layer 34, which is provided with a plurality of transparent linear electrodes 34a, 34a, . . . arrayed in parallel with one another. The transparent linear electrodes 34a, 34a, . . . are capable of transmitting line-like address light. The first electrode layer 31, the displaying layer 32, the optical switching layer 33, and the second electrode layer 34 are overlaid in this order.

The image displaying apparatus comprises the image displaying medium 30 described above and voltage applying sections 36, 36, . . . , each of which applies a predetermined voltage to one of the transparent linear electrodes 34a, 34a, . . . of the image displaying medium 30. The image displaying apparatus further comprises a line light source 40 for irradiating the line-like address light to the image displaying medium 30. The irradiation of the line-like address light is performed from the side of the second electrode layer 34 of the image displaying medium 30. The line light source 40 is moved by a movement mechanism (not shown) in the length direction of each of the transparent linear electrodes 34a, 34a, . . . , i.e. in the direction indicated by the arrow Y in FIG. 6A.

The first electrode layer 31 is constituted of a material capable of transmitting the visible light. For example, the first electrode layer 31 may be constituted of a tin dioxide film ($SnO_2$), an indium tin oxide (ITO) film, an Idemitsu Indium X-metal Oxide (IDIXO) film (an amorphous light-transmissive oxide film, supplied by Idemitsu Kosan K. K.), or the like, which has a thickness falling within the range of 50 nm to 200 nm.

As described above, the second electrode layer 34 is provided with the plurality of the transparent linear electrodes 34a, 34a, . . . The transparent linear electrodes 34a, 34a, . . . may be constituted of one of various materials, which are capable of transmitting the address light. For example, as in the cases of the first electrode layer 31, the transparent linear electrodes 34a, 34a, . . . may be constituted of ITO, IDIXO, or the like.

In this embodiment of the image displaying medium 30, an opaque good electrically-conductive member 35 extends on the top surface of a middle region 34c of each of the transparent linear electrodes 34a, 34a, . . . of the image displaying medium 30, which middle region is other than end regions 34b, 34b of each of the transparent linear electrodes 34a, 34a, . . . The opaque good electrically-conductive member 35 may be constituted of one of various materials, which have an electrical conductivity higher than the electrical conductivity of each of the transparent linear electrodes 34a, 34a, . . . By way of example, the opaque good electrically-conductive member 35 may be constituted of Al, Ag, Cu, or the like. The width of each of the end regions 34b, 34b, which are free from the opaque good electrically-conductive member 35, should preferably be longer than the wavelength of the address light. For example, in cases where the blue light having a wavelength of approximately 0.5 μm is utilized as the address light, the width of each of the end regions 34b, 34b should preferably be equal to at least 0.5 μm, and should more preferably fall within the range of approximately 1 μm to approximately 2 μm. Also, the total of the widths of the two end regions 34b, 34b should preferably be equal to at least ⅓ of the width of each of the transparent linear electrodes 34a, 34a, . . .

The displaying layer 32 is constituted of a liquid crystal layer 32a, which is constituted of a liquid crystal, and a light absorbing layer 32b, which is constituted of a black sheet. As the liquid crystal constituting the liquid crystal layer 32a of the displaying layer 32, a polymer network liquid crystal (PNLCD) should preferably be utilized.

The optical switching layer 33 comprises a first electric charge generating layer 33a and a second electric charge generating layer 33c, each of which is capable of generating the electric charges when being exposed to the address light. The optical switching layer 33 also comprises a positive hole transporting layer 33b, which is located between the first electric charge generating layer 33a and the second electric charge generating layer 33c. Each of the first electric charge generating layer 33a and the second electric charge generating layer 33c may be constituted of one of various materials, which are capable of generating the electric charges when being exposed to the address light. Each of the first electric charge generating layer 33a and the second electric charge generating layer 33c should preferably be constituted of, for example, a photo-conductive material containing, as a principal constituent, at least one substance selected from the group consisting of a-Se, Se—Te, Se—As—Te, metal-free phthalocyanine, metallo-phthalocyanine, magnesium phthalocyanine (MgPc), phase II of vanadyl phthalocyanine (VoPc), and copper phthalocyanine (CuPc).

Also, the positive hole transporting layer 33b may be constituted of one of various materials, which have the characteristics such that the difference between the mobility of positive electric charges and the mobility of negative electric charges is large (e.g., at least $10^2$, and preferably at least $10^3$). The positive hole transporting layer 33 should preferably be constituted of, for example, anorganic compound, such as a poly-N-vinylcarbazole (PVK), N,N'-diphenyl-N,N'-bis(3-methylphenyl)-[1,1'-biphenyl]-4, 4'-diamine (TPD), or a disk-shaped liquid crystal; or a semiconductor substance, such as a polymer (polycarbonate, polystyrene, PVK) dispersion of TPD.

Each of the voltage applying sections 36, 36, ... applies a voltage of +30V or 0V (i.e., the ground voltage) to one of the transparent linear electrodes 34a, 34a, ... in accordance with a given image signal.

The line light source 40 is moved by the movement mechanism (not shown) in the direction indicated by the arrow Yin FIG. 6A. The image displaying medium 30 is thus scanned with the line-like address light produced by the line light source 40. In this embodiment, as described above, the line-like address light is moved in the direction indicated by the arrow Y, and the entire area of the surface of the image displaying medium 30 is there by scanned with the address light. Alternatively, the scanning with spot-like light may be performed along the array direction of the transparent linear electrodes 34a, 34a, ..., along which direction the transparent linear electrodes 34a, 34a, ... stand side by side with one another, and along the direction indicated by the arrow Y, and the entire area of the surface of the image displaying medium 30 may thus be scanned with the spot-like light.

How the image displaying apparatus operates will be described hereinbelow.

Firstly, in the state, in which the first electrode layer 31 is grounded, pixel signal components corresponding to one line, which are among the pixel signal components constituting an image signal representing an image to be displayed on the image displaying medium 30, are fed into the voltage applying sections 36, 36, ... In accordance with the received pixel signal components corresponding to the one line, each of the voltage applying sections 36, 36, ... applies the voltage to the corresponding one of the transparent linear electrodes 34a, 34a, ... In this embodiment, the voltage of 0V is applied to a transparent linear electrode 34a corresponding to a pixel, which is to be seen as a black pixel in cases where the image displaying medium 30 is seen from the direction indicated by the arrow A in FIG. 6B. Also, the voltage of +30V is applied to a transparent linear electrode 34a corresponding to a pixel, which is to be seen as a white pixel in cases where the image displaying medium 30 is seen from the direction indicated by the arrow A in FIG. 6B.

The application of the voltage to each of the transparent linear electrodes 34a, 34a, ... is performed in the manner described above, and the line light source 40 is actuated to irradiate the address light extending along the array direction of the transparent linear electrodes 34a, 34a, ..., along which direction the transparent linear electrodes 34a, 34a, ... stand side by side with one another. The irradiation of the address light is performed from the side of the second electrode layer 34 of the image displaying medium 30. The address light, which has been irradiated from the side of the second electrode layer 34 of the image displaying medium 30, impinges upon the second electric charge generating layer 33c of the optical switching layer 33. Also, part of the address light, which has passed through the second electric charge generating layer 33c and the positive hole transporting layer 33b, impinges upon the first electric charge generating layer 33a.

When each of the first electric charge generating layer 33a and the second electric charge generating layer 33c is exposed to the address light, the electric charges are generated in each of the first electric charge generating layer 33a and the second electric charge generating layer 33c. As described above, the end regions 34b, 34b of each of the transparent linear electrodes 34a, 34a, ... are free from the opaque good electrically-conductive member 35. Therefore, the electric charges are capable of being generated in each of the first electric charge generating layer 33a and the second electric charge generating layer 33c by the address light having passed through the end regions 34b, 34b. Accordingly, the electric charges are capable of being generated in a wide range of the area, which range is taken in the array direction of the transparent linear electrodes 34a, 34a, ... (i.e., in the direction normal to the longitudinal direction of each of the transparent linear electrodes 34a, 34a, ...).

Of the electric charges having been generated in the range of the area of the first electric charge generating layer 33a, which range corresponds to the transparent linear electrode 34a having been applied with the positive voltage, the positive charges move toward the side of the first electrode layer 31 having been grounded and accumulate at the interface of the first electric charge generating layer 33a with respect to the displaying layer 32. Of the electric charges having been generated in the range of the area of the first electric charge generating layer 33a, which range corresponds to the transparent linear electrode 34a having been applied with the positive voltage, the negative charges accumulate at the interface of the first electric charge generating layer 33a with respect to the positive hole transporting layer 33b.

Also, of the electric charges having been generated in the range of the area of the second electric charge generating layer 33c, which range corresponds to the transparent linear electrode 34a having been applied with the positive voltage, the positive charges move through the positive hole transporting layer 33b and toward the side of the first electrode layer 31 having been grounded. The positive charges, which have thus moved through the positive hole transporting layer 33b and toward the side of the first electrode layer 31 having been grounded, combine with the negative charges, which have accumulated at the interface of the first electric charge generating layer 33a with respect to the positive hole transporting layer 33b. The positive charges described above thus disappear. Of the electric charges having been generated in the range of the area of the second electric charge generating layer 33c, which range corresponds to the transparent linear electrode 34a having been applied with the positive voltage, the negative charges combine with the positive charges of the transparent linear electrode 34a and disappear.

In the ranges of the areas of the first electric charge generating layer 33a and the second electric charge generating layer 33c, which ranges correspond to a transparent linear electrode 34a having been grounded, since the electric field is not formed, the electric charges are not generated.

As illustrated in FIG. 6B, as a result of the effects described above, of the electric charges having been generated in the first electric charge generating layer 33a, only the positive charges accumulate at the interface of the first electric charge generating layer 33a with respect to the displaying layer 32. The electric field is thus formed between the range of the area of the first electric charge generating layer 33a, which range corresponds to the transparent linear electrode 34a having been applied with the positive voltage, and the corresponding range of the area of the first electrode layer 31. In accordance with the thus formed electric field, the orientations of major axes of the liquid crystal molecules, which are contained in the liquid crystal layer 32a of the displaying layer 32, alter. Specifically, in the range of the area of the liquid crystal layer 32a, which range corresponds to the transparent linear electrode 34a having been applied with the positive voltage, since the electric field is formed by the positive charges, which have been accumulated in the first electric charge generating layer 33a, and between the first electric charge generating layer 33a and the first electrode layer 31 in the manner as described above, the orientations of the major axes of the liquid crystal molecules coincide with the direction indicated by the arrow A in FIG. 6B. As a result, when the image displaying medium 30 is seen from the direction indicated by the arrow A in FIG. 6B, the aforesaid range of the area of the liquid crystal layer 32a is displayed as a black area. Also, in the range of the area of the liquid crystal layer 32a, which range corresponds to the transparent linear electrode 34a having been grounded, since the electric charges are not generated in the first electric charge generating layer 33a and the second electric charge generating layer 33c, and since the electric field is not formed between the first electric charge generating layer 33a and the first electrode layer 31, the orientations of the major axes of the liquid crystal molecules become irregular, and light scattering occurs. As a result, when the image displaying medium 30 is seen from the direction indicated by the arrow A in FIG. 6B, the aforesaid range of the area of the liquid crystal layer 32a is displayed as a white area.

After the displaying along the one line has been finished in the manner described above, the line light source 40 is moved in the direction indicated by the arrow Y in FIG. 6A. Also, the pixel signal components corresponding to a next line, which are among the pixel signal components constituting the image signal representing the image to be displayed on the image displaying medium 30, are fed into the voltage applying sections 36, 36, . . . Further, in the same manner as that described above, the displaying of the white area and the black area along the next one line is performed. The operation described above is iterated for all of the lines, and the image is ultimately displayed on the entire area of the surface of the image displaying medium 30.

As described above, in this embodiment of the image displaying medium 30, the end regions 34b, 34b of each of the transparent linear electrodes 34a, 34a, . . . are free from the opaque good electrically-conductive member 35. Therefore, in the displaying layer 32, the electric field is capable of being formed over a wide range of the area, which range is taken in the array direction of the transparent linear electrodes 34a, 34a, . . . (i.e., in the direction normal to the longitudinal direction of each of the transparent linear electrodes 34a, 34a, . . . ). Accordingly, the image information is capable of being displayed appropriately also in the range of the area of the displaying layer 32, which range corresponds to the area between the adjacent transparent linear electrodes 34a, 34a.

In this embodiment of the image displaying medium 30, the displaying layer 32 is constituted of the liquid crystal layer 32a and the light absorbing layer 32b. Alternatively, for example, a displaying layer may be constituted of a dispersion layer and a light absorbing layer. In such cases, the dispersion layer contains a plurality of micro-capsules dispersed therein. Each of the micro-capsules contains positively charged white particles and negatively charged black particles. In cases where the displaying layer, which is constituted of the dispersion layer and the light absorbing layer, is employed, in accordance with the electric field having been formed in the displaying layer, the white particles and the black particles, which are contained in each of the micro-capsules having been dispersed in the dispersion layer of the displaying layer, move within each of the micro-capsules. As a result of the movements of the white particles and the black particles within each of the micro-capsules, the area of each of the micro-capsules, which area is close to the side of the first electrode layer and in which area the white particles have been collected, is displayed as a white area when the image displaying medium is seen from the direction indicated by the arrow A in FIG. 6B. Also, the area of each of the micro-capsules, which area is close to the side of the first electrode layer and in which area the black particles have been collected, is displayed as a black area when the image displaying medium is seen from the direction indicated by the arrow A in FIG. 6B.

The layer constitution of the image displaying medium in accordance with the present invention, which is employed in the image displaying apparatus, is not limited to the layer constitution employed in the embodiment of the image displaying medium described above. A different layer may be added to the layer constitution employed in the embodiment of the image displaying medium described above.

What is claimed is:

1. A radiation image recording medium, comprising:
    i) a charge accumulating layer, which generates electric charges when it is exposed to radiation carrying image information, and which accumulates the electric charges and thereby records the image information,
    ii) a reading photo-conductor layer, which generates electric charges when it is exposed to a reading electromagnetic wave, the electric charges combining with the electric charges, which have been accumulated in the charge accumulating layer, and
    iii) an electrode layer, which is constituted of a plurality of transparent linear electrodes having transmissivity to the reading electromagnetic wave and a plurality of electromagnetic wave non-transmissive linear electrodes for blocking the reading electromagnetic wave, the transparent linear electrodes and the electromagnetic wave non-transmissive linear electrodes being arrayed alternately and in parallel,
    the charge accumulating layer, the reading photo-conductor layer, and the electrode layer being overlaid in this order,
    wherein the improvement comprises the provision of an opaque good electrically-conductive member, which extends at a middle region of each of the transparent linear electrodes, the middle region being other than an end region extending along a longitudinal direction of each of the transparent linear electrodes.

2. A radiation image recording medium as defined in claim 1 wherein a width of the end region of each of the transparent linear electrodes is equal to at least a wavelength of the reading electromagnetic wave.

3. A radiation image recording medium as defined in claim 1 wherein a width of the end region of each of the transparent linear electrodes is at least 0.5 μm.

4. A radiation image recording medium, comprising:
  i) a charge accumulating layer, which generates electric charges when it is exposed to radiation carrying image information, and which accumulates the electric charges and thereby records the image information,
  ii) a reading photo-conductor layer, which generates electric charges when it is exposed to a reading electromagnetic wave, the electric charges combining with the electric charges, which have been accumulated in the charge accumulating layer, and
  iii) an electrode layer, which is constituted of a plurality of transparent linear electrodes having transmissivity to the reading electromagnetic wave, the transparent linear electrodes being arrayed in parallel,
  the charge accumulating layer, the reading photo-conductor layer, and the electrode layer being overlaid in this order,
  wherein the improvement comprises the provision of an opaque good electrically-conductive member, which extends at a middle region of each of the transparent linear electrodes, the middle region being other than an end region extending along a longitudinal direction of each of the transparent linear electrodes.

5. A radiation image recording medium as defined in claim 4 wherein a ratio of a width of each of the transparent linear electrodes to an array pitch of the transparent linear electrodes is at most 40%.

6. A radiation image recording medium as defined in claim 4 wherein a width of the end region of each of the transparent linear electrodes is equal to at least a wavelength of the reading electromagnetic wave.

7. A radiation image recording medium as defined in claim 4 wherein a width of the end region of each of the transparent linear electrodes is at least 0.5 μm.

8. An image displaying medium, comprising:
  i) a displaying layer, whose optical characteristics alter in accordance with an applied electric field,
  ii) an optical switching layer, which generates electric charges for the formation of the electric field when being exposed to a displaying electromagnetic wave, and
  iii) an electrode layer, which is constituted of a plurality of transparent linear electrodes having transmissivity to the displaying electromagnetic wave, the transparent linear electrodes being arrayed in parallel,
  the displaying layer, the optical switching layer, and the electrode layer being overlaid in this order,
  wherein the improvement comprises the provision of an opaque good electrically-conductive member, which extends at a middle region of each of the transparent linear electrodes, the middle region being other than an end region extending along a longitudinal direction of each of the transparent linear electrodes.

9. An image displaying medium as defined in claim 8 wherein a width of the end region of each of the transparent linear electrodes is equal to at least a wavelength of the displaying electromagnetic wave.

10. An image displaying medium as defined in claim 8 wherein a width of the end region of each of the transparent linear electrodes is at least 0.5 μm.

* * * * *